United States Patent [19]
Ishida et al.

[11] Patent Number: 6,000,958
[45] Date of Patent: Dec. 14, 1999

[54] CARD EJECTOR FOR PC CARD CONNECTOR

[75] Inventors: Mitsuo Ishida; Syu Obara, both of Tokyo, Japan

[73] Assignee: Hirose Electric Co., Ltd., Tokyo, Japan

[21] Appl. No.: 08/968,522

[22] Filed: Nov. 12, 1997

[30] Foreign Application Priority Data

Nov. 12, 1996 [JP] Japan .................................. 8-314130

[51] Int. Cl.$^6$ ............................................. H01R 13/62
[52] U.S. Cl. ........................................................ 439/159
[58] Field of Search ............................................ 439/159

[56] References Cited

U.S. PATENT DOCUMENTS 5,443,395 8/1995 Wang ...................................... 439/159

*Primary Examiner*—Neil Abrams
*Assistant Examiner*—Javaid Nasri
*Attorney, Agent, or Firm*—Kanesaka & Takeuchi

[57] ABSTRACT

A card ejector for a PC card connector, includes an ejector button (1) movable between a retreated position and an advanced position where a PC card is ejected from the PC card connector; an ejector bar (2) for guiding the ejector button (1) by a predetermined distance between the retreated position and the advanced position; a spring member (10) provided between the ejector button (1) and the ejector bar (2) to bias the ejector button (1) to the retreated position where the ejector button (1) is rotatable by a predetermined angle with respect to the ejector bar (2).

4 Claims, 7 Drawing Sheets

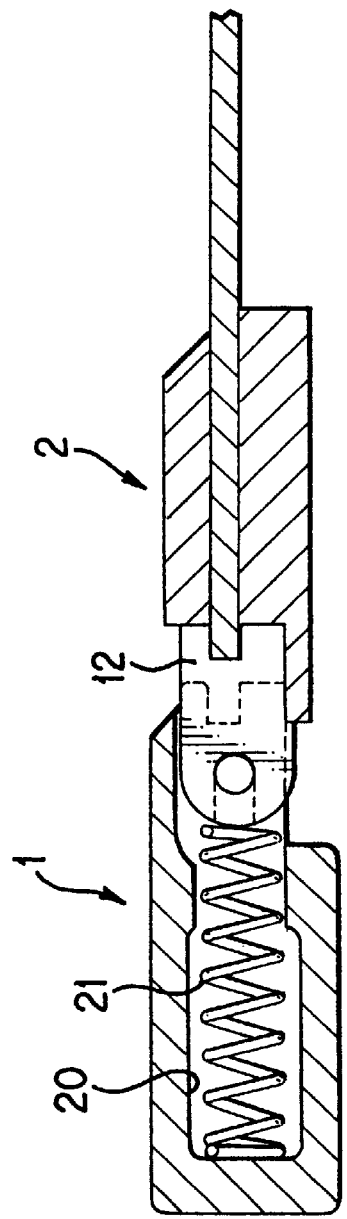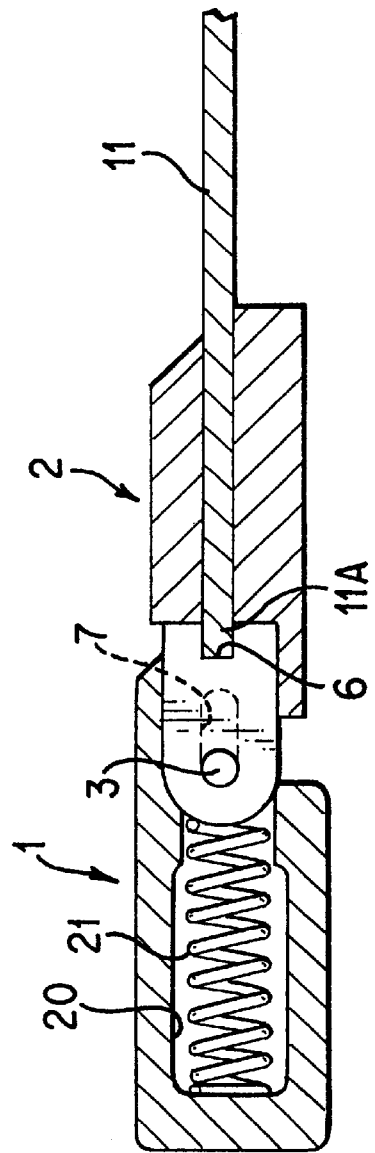

CARD EJECTOR FOR PC CARD CONNECTOR

BACKGROUND OF THE INVENTION

1. Field of the Invention

The present invention relates to card ejectors for PC card connectors.

2. Description of the Related Art

A PC card is inserted into a PC card connector through the slot, and the leading end is connected to the connector. The tailing portion is protruded for removal.

The connector is provided with a removal mechanism for ejecting the PC card. An ejector bar is provided on the side of the connector to operate the removal mechanism. An ejector button is protruded from the housing and, when the operator pushes the ejector button, the ejector bar operates the removal mechanism.

A conventional ejector will be described with reference to FIGS. 10 and 11. In FIG. 10, an ejector bar 51 consists of a metal bar 51A and a plastic pressure receiving section 51B attached to an end of the metal bar. An ejector button 53 is rotatably connected to the pressure receiving section 51B by a pin 52. The ejector bar 51 is placed in the housing but the ejector button 53 protrudes from the housing.

To remove the PC card, the operator pushes the ejector button 53 to the right in FIG. 10 to advance the ejector bar 51. The advancement of the ejector bar 51 operates the removal mechanism (not shown) to eject the PC card. When the ejector button is not used, it is rotated at right angles with respect to the ejector bar 51 as shown in FIG. 11 minimizing the projected portion of the ejector button 53 to avoid accidental depression of the ejector button.

Another ejector is shown in FIGS. 12–14. An ejector bar 61 consists of a metal bar 61A and a plastic pressure receiving section 61B. An ejector button 63 is rotatably connected to the pressure receiving section 61B by a pin 62. A slot (not shown) is provided in the pressure receiving section 61B so that the ejector button 63 is movable by a predetermined distance with respect to the ejector bar 61. As shown in FIG. 12, the ejector button 63 has a stepped leading section which slidably engages the stepped leading section of the pressure receiving section 61B of the ejector bar 61.

To eject the PC card, the ejector button 63 is pressed from the position of FIG. 12 to the position of FIG. 13 where the ejector button 63 pushes the ejector bar 61. When the ejector button 63 is not used, the ejector button 63 is pulled back to the retreated position of FIG. 12 and then rotated at right angles to the position of FIG. 14.

In the ejector of FIG. 10, however, the ejector button can be rotated when it is pushed, making difficult removal of the PC card. In the ejector of FIG. 12, in order to bring the ejector button into the rotated position, it is necessary to pull the ejector button to the retreated position of FIG. 12, imaking the operation complicated. Where the ejector button is rotated without the pulling operation, it can be broken. It happens frequently when the operator is not familiar with the ejector button.

SUMMARY OF THE INVENTION

Accordingly, it is an object of the invention to provide a card ejector for a PC card connector, which is able to hold the ejector button at the rotatable position so that the ejector button is rotated by a simple operation.

According to the invention there is provided a card ejector which includes an ejector button, an ejector bar for guiding the ejector button by a predetermined distance, and a spring member provided between the ejector button and the ejector bar to bias the ejector button to a retreated position where the ejector button is rotatably connected to the ejector bar.

The ejector button is biased so that it is normally at the retreated position. To remove the PC card, the ejector button is depressed against the spring member for movement in the predetermined distance to push the ejector bar.

When the pressure on the ejector button is removed, the ejector button is returned to the retreated position so that when it is not used, it can be brought into the rotated position with ease.

BRIEF DESCRIPTION OF THE DRAWINGS

FIG. 5 is a longitudinal section of an ejector according to the second embodiment of the invention, wherein the ejector button is at the retreated position;

FIG. 6 is a longitudinal section of the ejector of FIG. 5, wherein the ejector button is at the advanced position;

DESCRIPTION OF THE PREFERRED EMBODIMENT

Figure 1:
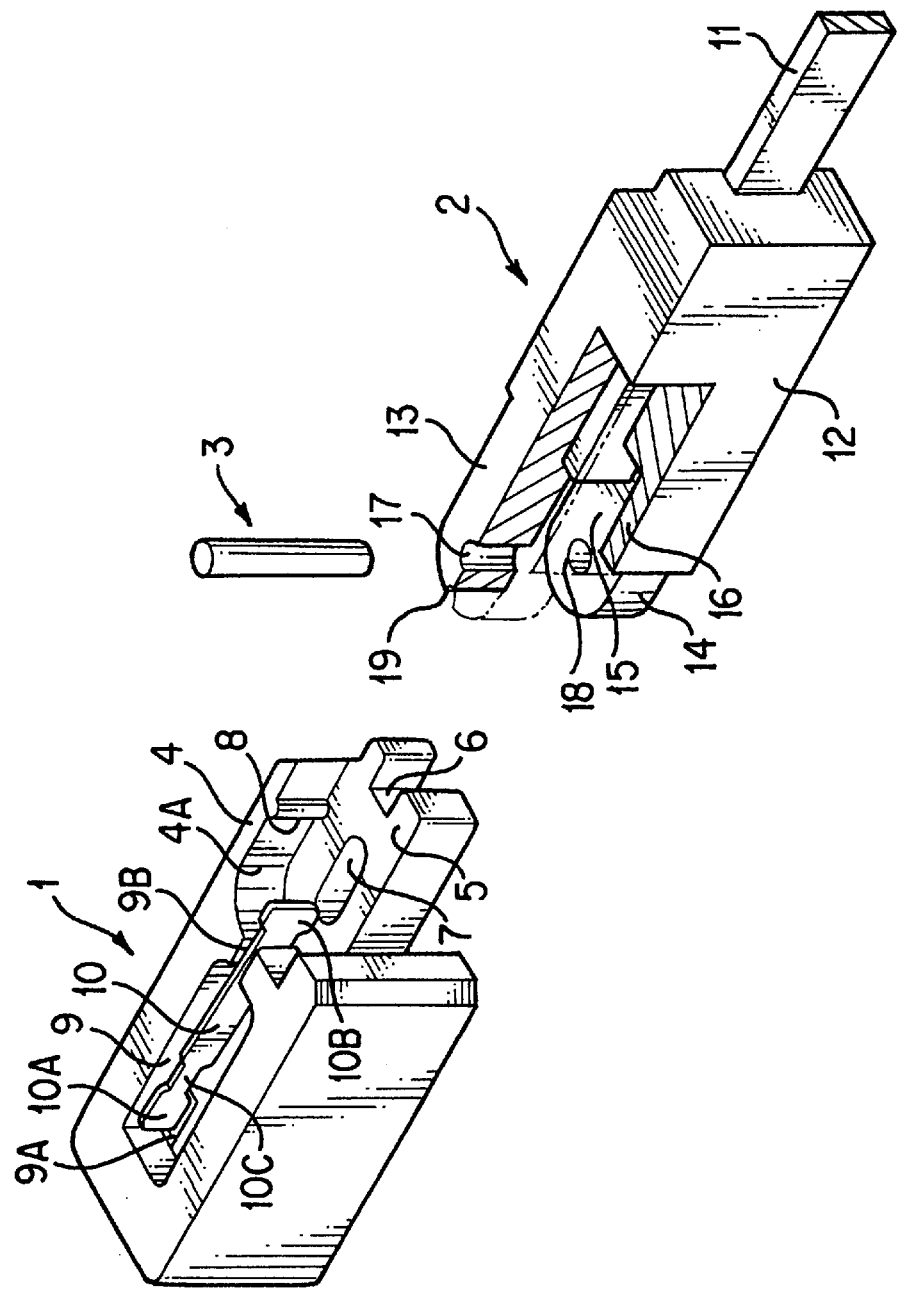
FIG. 1 is an exploded perspective view of an ejector according to the first embodiment of the invention.
Figure 2:
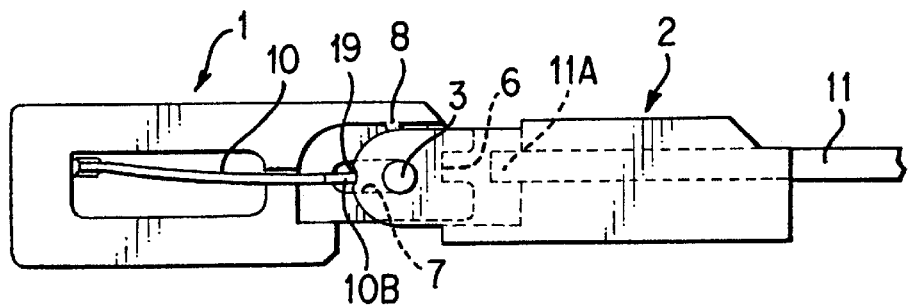
FIG. 2 is a plan view of the ejector of FIG. 1 wherein the ejector button is at the retreated position.

In FIGS. 1 and 2, an ejector button 1 is rotatably connected to an ejector bar 2 by a pin 3. The ejector button 1 has an extended section 4 with a flat portion 5. The flat portion 5 has an engaging recess 6 at the tail end and a slot 7 at the center. An engaging ridge 8 is provided on a curved inner face of the extended section 4.

A cavity 9 is provided in the ejector button 1, and a leaf spring 10 is provided in the cavity 9. An engaging slit 9A extends downwardly from the cavity 9 while a guiding slit 9B is provided at the end of the cavity 9.

The leaf spring 10 has an L-shape and a downward leg 10A which is held in the engaging slit 9A. The end portion 10B goes through the guide slit 9B. Also, it has a neck portion 10C near the downward leg so that when it receives a force, it flexes at the neck portion 10C.

A pressure receiving section 12 is attached to the metal bar 11. The pressure receiving section 12 has a pair of supports 13 and 14 forming a guide groove 15 between them. The bar 11 projects into the guide groove 15 to provide a projection 11A (FIG. 2). A side wall 16 extends from the pressure receiving section 12 on the side opposite to the extended section 4 of the ejector button 1. A couple of pin holes 17 and 18 are provided in the support sections 13 and 14 in the same line so that the pin 3 goes through the pin hole 17, the slot 7, and pin hole 18. Consequently, the ejector button 1 is movable by the length of the slot 7 with respect to the ejector bar 2. An engaging groove 19 is provided in the upper support section 13 to receive the end 10B of the leaf spring 10.

Before the card is removed, the ejector button 1 and the ejector bar 2 are in a straight line as shown in FIG. 2. The ejector button 1 is pushed to the retreated position by the leaf spring 10 as the pin 3 is guided by the slot 7 of the ejector button. At this point, the engaging recess 6 of the ejector button 1 is disengaged from the projection 11A of the ejector bar 2.

Figure 3:
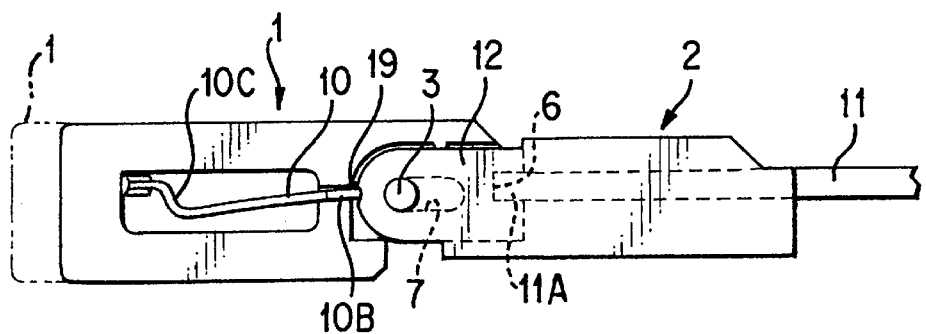
FIG. 3 is a plan view of the ejector wherein the ejector button is at the advanced position.
Figure 15:
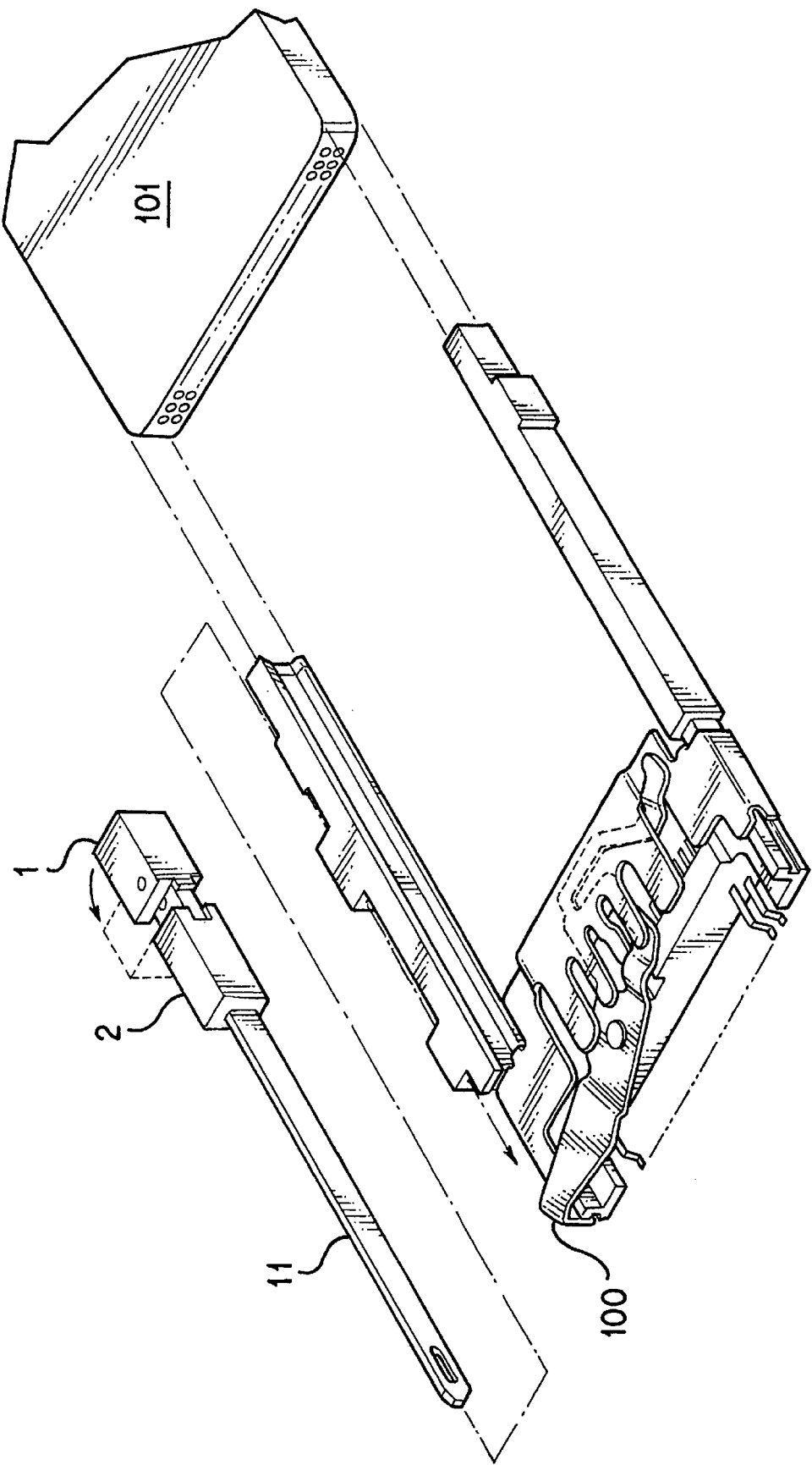
FIG. 15 is a perspective view of the card and ejector mechanism.

To remove the card, when the ejector button 1 is depressed from the position of FIG. 2 to the position of FIG. 3, the leaf spring 10 is flexed at the neck portion 10C so that the ejector button 1 abuts on the leading end of the ejector bar 2. Consequently, the protruded portion 11A of the bar 11 engages the engaging recess 6. When the ejector button 1 is further pushed, the ejector bar 2 operates the removal mechanism 100 (FIG. 15) to release the PC card 101 from the connector. When the pressure on the ejector button 1 is removed, the leaf spring 10 brings the ejector button 1 to the original retreated position of FIG. 2.

Figure 4:
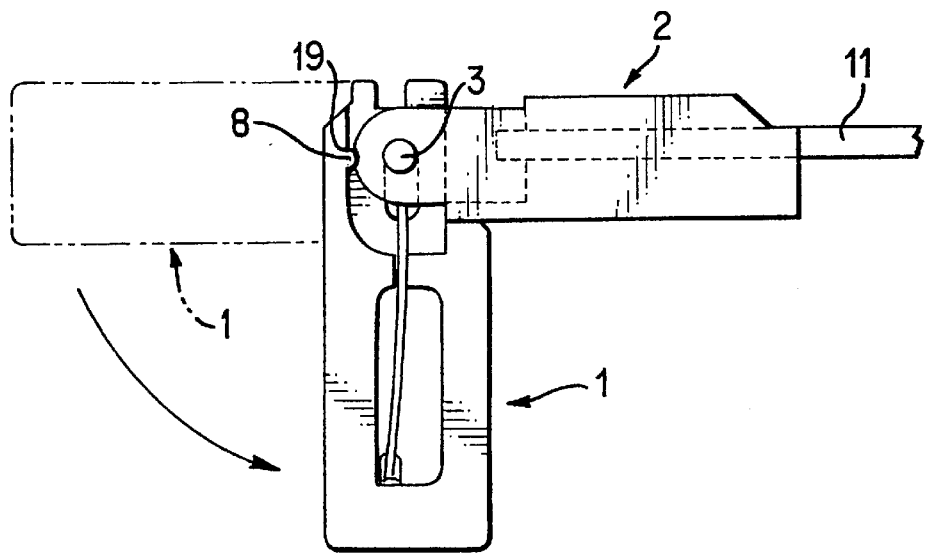
FIG. 4 is a plan view of the ejector wherein the ejector button is at the rotated position.

When the ejector button 1 is not used, it is rotated about the pin 3 from the position of FIG. 2 to the position of FIG. 4. Since the engaging recess 6 is disengaged from the protruded portion 11A of the bar 11, it is easy to rotate the ejector button 1. The engaging projection 8 of the ejector button 1 fits in the engaging groove 19 of the ejector bar 2 to lock the rotation.

The second embodiment of the invention will be described with respect to FIG. 5. This embodiment is characterized by a compression spring provided in place of the leaf spring in the first embodiment.

In FIG. 5, a cavity 20 is provided in the ejector button, and a compression spring 21 is provided in the cavity 20. The tailing end of the compression spring 21 abuts against the leading end of the ejector bar 2 to bring the ejector button 1 to the retreated position.

To remove the PC card, the ejector button 1 is pressed against the compression spring 21 so as to bring it from the position of FIG. 5 to the position of FIG. 6. The guiding operation of the pin 3 by the slot 7, the engagement between the engaging recess and the engaging projection 11A, and the subsequent movement of the ejector bar 2 are the same as those of the first embodiment.

When the ejector button 1 is not used, the ejector button 1 is rotated downwardly as in FIG. 2.

The third embodiment of the invention will be described with reference to FIGS. 7–9. This embodiment is characterized by a spring member provided in the ejector bar instead of the ejector button.

Figure 7:
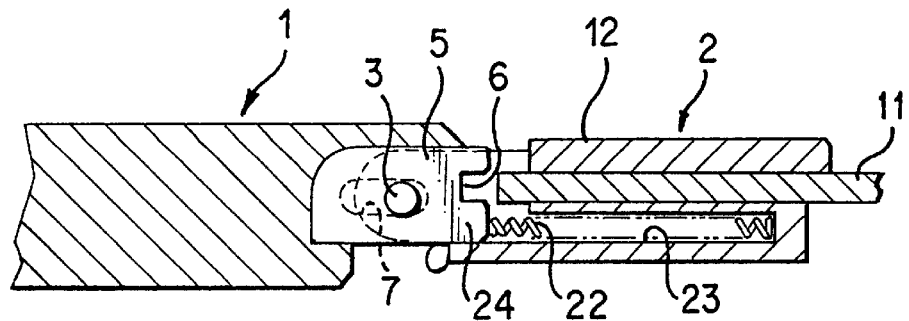
FIG. 7 is a longitudinal section of an ejector according to the third embodiment of the invention, wherein the ejector button is at the retreated position.

In FIG. 7, a cavity 23 is provided in the pressure receiving section 12 to receive the compression spring 22. The compression spring 22 abuts against a projection 24 of the engaging recess 6 so that the ejector button is biased to the advanced position. The other components are the same as the above embodiment and the description will be omitted.

To remove the PC card, the ejector button 1 is pressed against the compression spring 22 as in the above embodiment.

Figure 8:
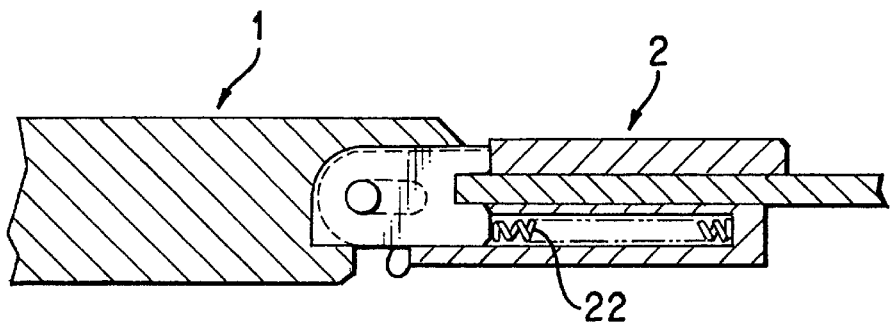
FIG. 8 is a longitudinal section of the ejector of FIG. 7, wherein the ejector button is at the advanced position.
Figure 9:
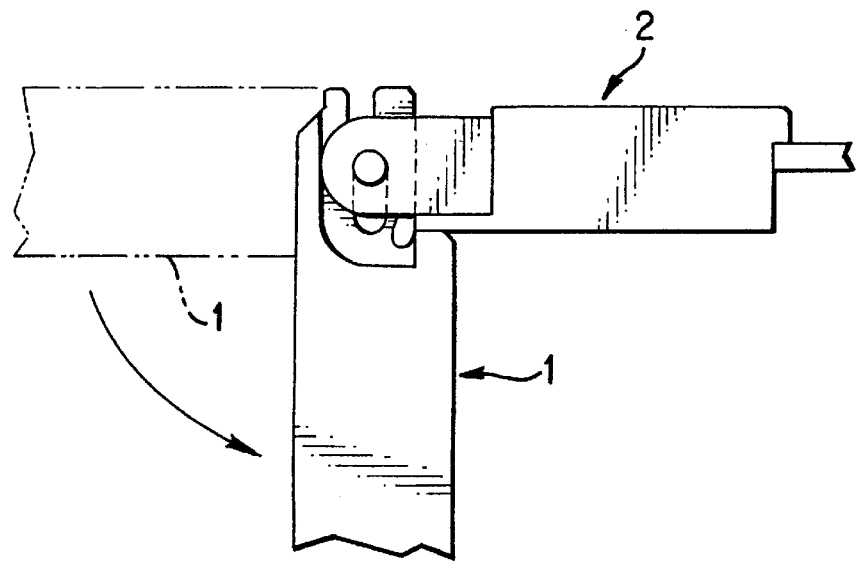
FIG. 9 is a plan view of the ejector of FIG. 7, wherein the ejector button is at the rotated position.
Figure 10:
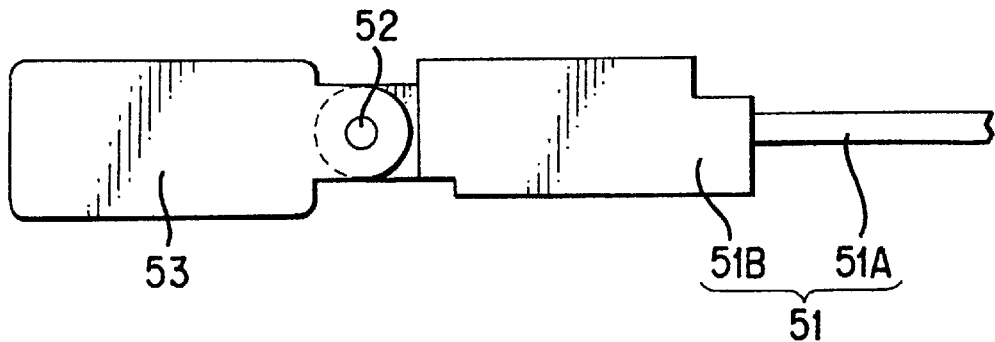
FIG. 10 is a plan view of a conventional ejector wherein the ejector button and the ejector bar are in a straight line.
Figure 11:
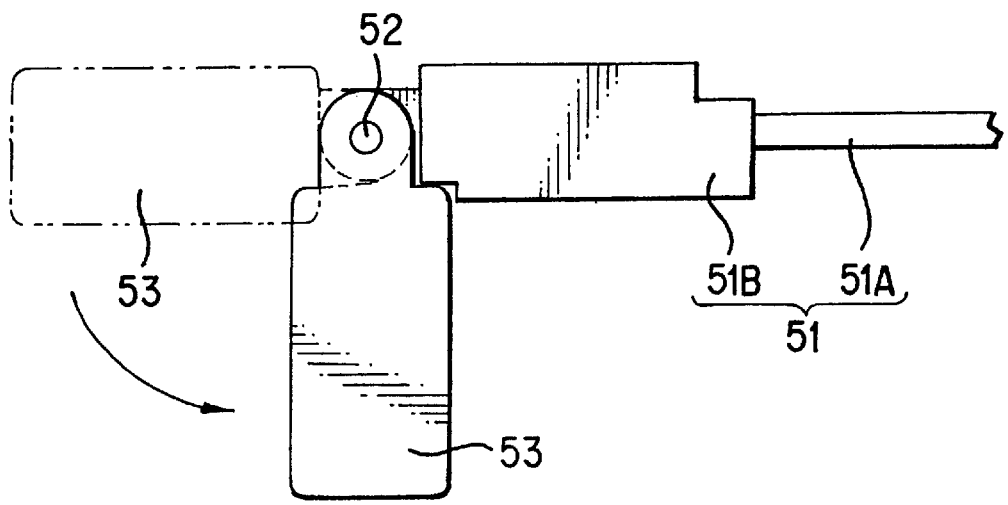
FIG. 11 is a plan view of the ejector of FIG. 10, wherein the ejector button is at the rotated position.
Figure 12:
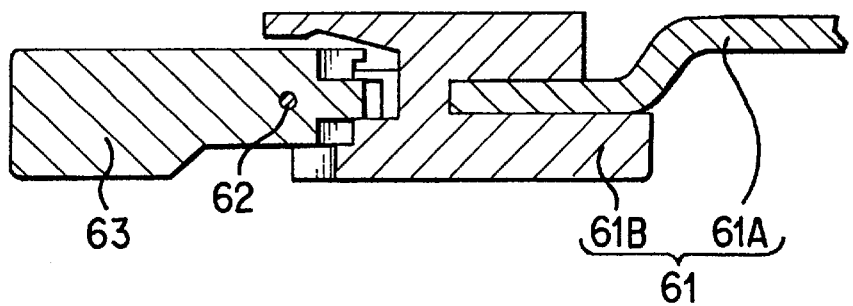
FIG. 12 is a longitudinal section of another conventional ejector, wherein the ejector button is at the retreated position.
Figure 13:
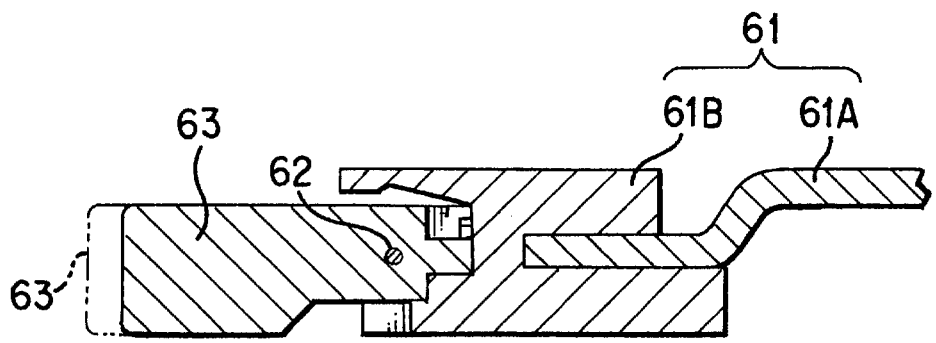
FIG. 13 is a longitudinal section of the ejector of FIG. 12, wherein the ejector button is at the advanced position.
Figure 14:
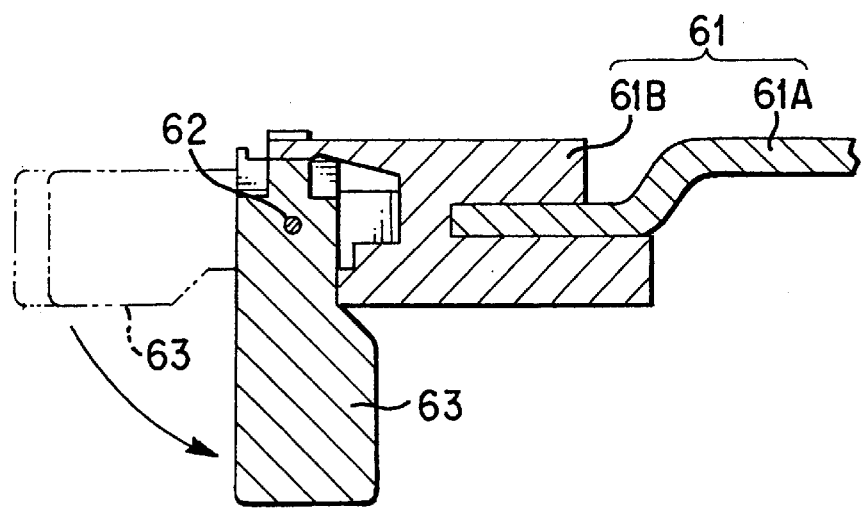
FIG. 14 is a longitudinal section of the ejector of FIG. 12, wherein the ejector button is at the rotated position.

When the ejector button 1 is not used, it is rotated from the position of FIG. 7 to the position of FIG. 8 as in the above embodiment.

As has been described above, according to the invention, the ejector button is biased to the advanced position and is made rotatable so that when it is not used, it is rotated to the folded position. When the PC card is removed, the ejector button simply is pressed. Where it is rotated accidentally, no damage is made to it.

What is claimed is:

1. A card ejector for a PC card connector, comprising:

an ejector button movable between a retreated position and an advanced position where said PC card is ejected from said PC card connector;

an ejector bar for guiding said ejector button by a predetermined distance between said retreated position and said advanced position;

a spring member provided between said ejector button and said ejector bar to bias said ejector button to said retreated position and to keep said elector button at said retreated position where said ejector button is rotatable by a predetermined angle with respect to said ejector bar.

2. The card ejector according to claim 1, wherein said spring member includes a leaf spring provided in said ejector button.

3. The card ejector according to claim 1, wherein said spring member includes a compression spring provided in said ejector button.

4. The card ejector according to claim 1, wherein said spring member includes a compression spring provided in said ejector bar.

* * * * *